United States Patent
Arps et al.

(10) Patent No.: US 8,524,364 B2
(45) Date of Patent: Sep. 3, 2013

(54) TWO-DIMENSIONAL COMPOSITE PARTICLE ADAPTED FOR USE AS A CATALYST AND METHOD OF MAKING SAME

(75) Inventors: James H. Arps, Chanhassen, MN (US); Kent Edward Coulter, Fair Oaks Ranch, TX (US)

(73) Assignee: Southwest Research Institute, San Antonio, TX (US)

(*) Notice: Subject to any disclaimer, the term of this patent is extended or adjusted under 35 U.S.C. 154(b) by 0 days.

(21) Appl. No.: 13/168,630

(22) Filed: Jun. 24, 2011

(65) Prior Publication Data

US 2011/0262837 A1   Oct. 27, 2011

Related U.S. Application Data

(62) Division of application No. 11/736,800, filed on Apr. 18, 2007, now Pat. No. 7,968,488.

(60) Provisional application No. 60/792,758, filed on Apr. 18, 2006.

(51) Int. Cl.
*B22F 7/04*   (2006.01)
*B32B 3/02*   (2006.01)
*B32B 5/16*   (2006.01)

(52) U.S. Cl.
USPC .................. 428/403; 428/570; 428/601

(58) Field of Classification Search
USPC ............................ 428/570, 601, 403
See application file for complete search history.

(56) References Cited

U.S. PATENT DOCUMENTS

| | | | |
|---|---|---|---|
| 3,503,783 A | 3/1970 | Evans | |
| 4,059,443 A | 11/1977 | Okumura | |
| 5,077,258 A | 12/1991 | Phillips et al. | |
| 5,116,664 A * | 5/1992 | Kimura et al. | 428/216 |
| 5,135,812 A | 8/1992 | Phillips et al. | |
| 5,211,991 A | 5/1993 | Bullock | |
| 5,383,995 A | 1/1995 | Phillips et al. | |
| 5,399,432 A | 3/1995 | Schleifstein et al. | |
| 5,569,535 A | 10/1996 | Phillips et al. | |
| 6,153,327 A | 11/2000 | Dearnaley et al. | |
| 6,156,379 A | 12/2000 | Terada et al. | |

(Continued)

OTHER PUBLICATIONS

Janssens et al., Insights into the reactivity of supported Au nanoparticles: combining theory and experiments, Topics in Catalysis, vol. 44, Nos. 1-2, Jun. 2007, pp. 15-26.*

(Continued)

*Primary Examiner* — Hoa (Holly) Le
(74) *Attorney, Agent, or Firm* — Grossman, Tucker et al.

(57) ABSTRACT

The present invention is directed to a composite particle that is microscopically two-dimensional with a third nanoscopic dimension, and to methods of making same. The particle may include a support and a metal layer. The metal layer may be catalytically active such that the particle is adapted to act as a catalyst.

10 Claims, 3 Drawing Sheets

(56) References Cited

U.S. PATENT DOCUMENTS

| | | | |
|---|---|---|---|
| 6,241,858 B1 * | 6/2001 | Phillips et al. | 204/192.15 |
| 6,281,161 B1 | 8/2001 | Marsh | |
| 6,317,947 B1 | 11/2001 | Ruschmann | |
| 6,398,999 B1 | 6/2002 | Josephy et al. | |
| 6,586,098 B1 * | 7/2003 | Coulter et al. | 428/403 |
| 6,666,995 B1 | 12/2003 | Meikka et al. | |
| 6,863,851 B2 | 3/2005 | Josephy et al. | |
| 6,998,149 B2 | 2/2006 | Kohler et al. | |
| 7,144,627 B2 | 12/2006 | Halas et al. | |
| 7,224,528 B2 | 5/2007 | Phillips et al. | |
| 7,632,434 B2 | 12/2009 | Duescher | |
| 7,968,488 B2 | 6/2011 | Arps | |
| 2004/0101676 A1 | 5/2004 | Phillips et al. | |
| 2004/0146642 A1 | 7/2004 | Josephy et al. | |
| 2005/0069755 A1 | 3/2005 | Vernstrom et al. | |
| 2005/0186117 A1 | 8/2005 | Uchiyama et al. | |
| 2008/0166605 A1 * | 7/2008 | Arps et al. | 429/15 |

OTHER PUBLICATIONS

Wallace, et al., "The nucleation, growth, and stability of oxide-supported metal clusters," Topics in Catalysis vol. 34, Nos. 1-4, May 2005. pp. 17-30.

Goodman, "Catalytically active Au on Titania": yet another example of a strong metal support interaction (SMSI)? Catalysis Letters Vo. 99, Nos. 1-2, Jan. 2005, pp. 1-4.

Ross, "V.C.I New Electrocatalysts for Fuel Cells," FY 2006 Annual Progress Report, DOE Hydrogen Program; pp. 770-773 (Sep. 30, 2006).

U.S. Office Action dated Jun. 10, 2010 issued in related U.S. Appl. No. 11/736,800.

Notice of Allowance dated Mar. 15, 2011 issued in related U.S. Appl. No. 11/736,800.

* cited by examiner

TWO-DIMENSIONAL COMPOSITE PARTICLE ADAPTED FOR USE AS A CATALYST AND METHOD OF MAKING SAME

CROSS-REFERENCE TO RELATED APPLICATIONS

This application is a divisional of U.S. patent application Ser. No. 11/736,800, titled "TWO-DIMENSIONAL COMPOSITE PARTICLE ADAPTED FOR USE AS A CATALYST AND METHOD OF MAKING SAME", which was filed Apr. 18, 2007, and claims the benefit of U.S. Provisional Application No. 60/792,758, filed Apr. 18, 2006 and is entirely incorporated by reference.

FIELD OF THE INVENTION

The present invention relates generally to a composite particle, and specifically to a composite particle that is microscopically two-dimensional with a third nanoscopic dimension, its use as a catalyst, and a method of making the composite particle.

BACKGROUND OF THE INVENTION

Catalysts are used to increase the rate of chemical conversion of starting materials to products. Typically a catalyst lowers the energy of the highest energy reaction intermediate, termed the transition state intermediate. Since the rate of conversion typically increases with decreasing energy of the transition state, a catalyst speeds the conversion.

A major effort of catalysis is the pursuit of catalysts having improved activity without increasing cost. Many catalytically active metals, such as precious metals, are expensive. Thus, optimizing the usage of active materials is a major aspect of catalyst optimization.

Catalysis has been concerned with small particles for a long time. The initial incentive to reduce the size of the particles of active components was to maximize the specific cost per function. Recent investigations have focused on applications of nanotechnology in catalysis.

Studies of the use of nanoparticles for catalysis have revealed a nanocatalytic enhancement. Nanocatalytic enhancement is an increase in activity of a catalyst of nanoscale size with respect to a reference catalyst of the same material(s) at larger than nanoscale size. In nanocatalysis, the functional dimension of a chemical bond in the substrate molecule of the starting material or of the product has a typical length on the order of angstroms (Å), whereas a catalytic nanoparticle, with a size on the order of nanometers (nm), is typically more than 10 times as large. It is believed that the small ratio of the nanoparticle size to the substrate molecule size leads to the nanocatalytic enhancement.

The nanocatalytic enhancement is understood in more detail as follows. Catalytic phenomena arise from the intimate interconnection of processes between the substrate molecule and the active sites of the catalyst with solid-state chemical processes, which are brought about by the interaction of the whole catalyst material with the reactants and products. The combination of surface-science model experiments and chemical kinetics has shaped the image of a dynamic catalyst. A dynamic catalyst has a function governed by factors that are locally and temporally dependent on the catalyst function. These factors include surface structure of the catalyst, gas-phase chemical composition of the starting material and products, and the interaction of the surface structure and gas-phase chemical composition. It is believed that a reason for the nanoeffect in catalytic applications is the ability of nanostructured matter to occur in non-equilibrium modifications that are metastable under reaction conditions. It is further believed that the unique atomic-level geometries that emerge from nanoparticles enable orbital overlap of electronic densities of the catalyst with the reactant and product adsorbates that are not otherwise accessible, and they effectively lower the energy of the transition state intermediate.

Nanoparticle catalysts typically have a ball shape, or have other geometries that are essentially nanoscopic in three dimensions. Despite nanocatalytic enhancements to catalyst activity, a disadvantage of three-dimensional nanoscopic nanoparticles as stand-alone catalysts is the difficulty of handling the catalysts. Thus, there remains a need for an improved catalyst particle structure that combines the property of nanocatalytic performance with ease of handling.

BRIEF DESCRIPTION OF THE INVENTION

The above-mentioned needs are addressed by the present invention. In some embodiments, the present invention is directed to a composite particle that is microscopically two-dimensional with a third nanoscopic dimension and methods of making same. The particle may include a support and at least one metal layer. The support may include opposing surfaces, each supporting a metal layer. A metal layer may be catalytically active such that the particle is adapted to act as a catalyst. The catalyst may achieve a nanocatalytic performance associated with a nanoscopic thickness of the metal layer, yet may have an ease of handling associated with a microscopic extent of the catalyst in two dimensions.

In some embodiments, the present invention is directed to a method of making a catalyst particle that may include providing a web material having a release layer formed on an upper surface thereof, forming a composite film on the web material, and removing the composite film from the web material as a plurality of composite particles. The composite film may be formed by physical vapor deposition. The composite film may include a first metal film, a support film, and a second metal film. Forming the composite film may include controlling the forming so as to control the structures of the first and second metal films. The first and second metal films may include the same materials. Removing the composite film may include comminuting the film so as to form the plurality of composite particles.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is directed to a composite particle that is microscopically two dimensional with nanoscopic thickness, its use as a catalyst, and methods of making the composite particle.

Terminology

As used herein, the terms "flake" and "platelet" are used interchangeable and each denotes a microscopically two dimensional particle with nanoscopic thickness.

Thus, as used herein, the terms "composite platelet" and "composite flake" each denote a composite particle that is microscopically two dimensional with nanoscopic thickness.

As used herein, the term "microscopic" denotes sizes above 1 micron (μm) and up to and including 1 mm.

As used herein, the term "nanoscopic" denotes sizes from atomic scale to 1 micron, inclusive.

As used herein, the term "atomic thickness" denotes an extent not more than a monolayer of base constituent selected from among atoms and molecules.

Composite Platelet

Figure 1:
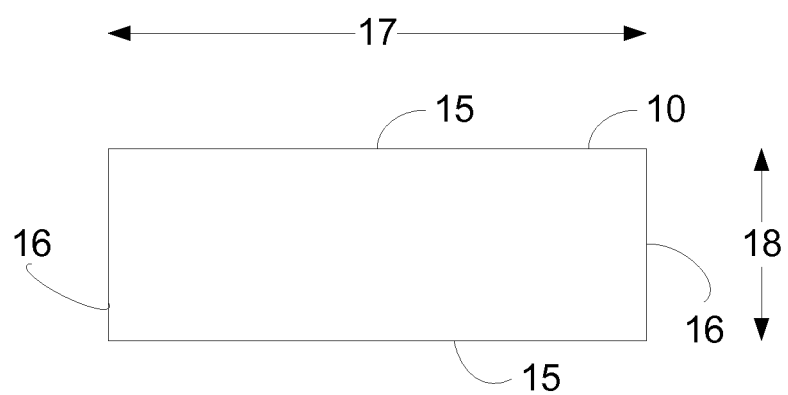
FIG. 1 is cross-sectional view of a composite particle, in accordance with some embodiments of the present invention.

Referring now to FIG. 1, composite particle 10 may include opposing face surfaces 15. Composite particle 10 may further include opposing edge surfaces 16. Diameter 17 quantifies the size of composite particle 10 along face surfaces 15. Diameter 17 has microscopic size. Thus, diameter 17 may be up about 1 mm. For example, diameter 17 may be at most about 150 nm. Thickness 18 quantifies the size of which composite particle 10, along edge surfaces 16, may be high. Thickness 18 has nanoscopic size. Thus, thickness 18 may be up to about 1 micron in size. The face to edge aspect ratio may be quantified as the ratio of diameter 17 to thickness 18. The face to edge aspect ratio may be high. For example, the aspect ratio may be at least about 6.5. When composite particle 10 has an irregular shape, the diameter is defined as the two-dimensional average distance of a straight line passing through the center of the particle.

Referring still to FIG. 1, advantages of the flake structure of composite particle 10 include precise thickness, surface property manipulation, and physical structure. Further, composite particle 10 has the advantage that it is very thin and dense so that all of the surface area is at the exterior of the composite particle 10. Thus, the composite particle 10 may be poreless.

Referring still to FIG. 1, opposing face surfaces 15 may be catalytic surfaces. Opposing face surfaces 15 may be metallic. A poreless catalyst has the advantage that metal utilization may be high. It is desirable to maximize the number of metal atoms at the surface that contribute to catalytic activity. It is expected that the high metal utilization possible improves activity as compared with conventional porous catalysts. For example, conventional fuel cell catalysts are known to have as little as 25% of the metal atoms exposed, as disclosed in P. N. Ross, "New Electrocatalysts for Fuel Cells," 2005 DOE Hydrogen Program Review, Arlington, Va., May 2005.

Figure 2A:
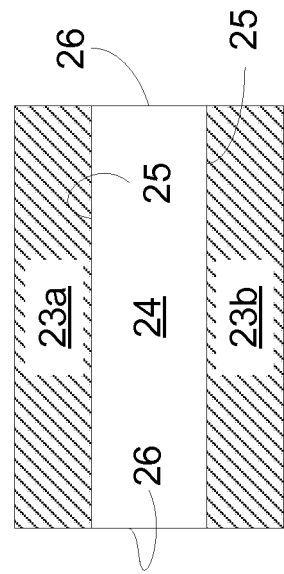
FIGS. 2(A)-2(B) depict cross-sectional views of a composite particle comprising a metal layer disposed about a support layer, in accordance with some embodiments of the present invention.
Figure 2B:
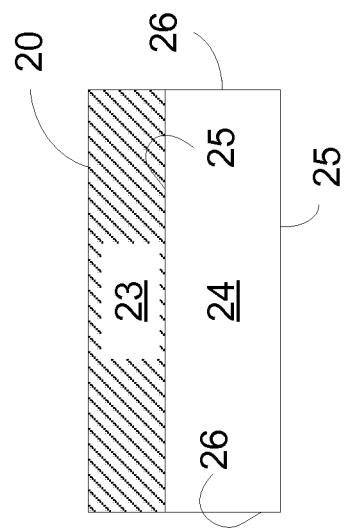

Referring now to FIGS. 2(A)-2(B), composite particle 20 may include metal layer 23 disposed about support layer 24. Referring now to FIG. 2(A), metal layer 23 may be disposed about one face surface 25. Referring now to FIG. 2(B), metal layers 23a and 23b may be disposed about both face surfaces 25, one metal layer each of 23a and 23b disposed about each opposing face surface 25. Any of metal layers 23, 23a, or 23b may contact support layer 24. Alternatively, any of metal layers 23, 23a, or 23b may be separated from support layer 24 by intermediate material. Support layer 24 may include opposing face surfaces 25. Support layer 24 may further include opposing edge surfaces 26. Support layer 24 may have nanoscopic thickness. For example, the thickness may range from at least about 50 nm to at most about 1 micron. Face surfaces 25 may be atomically smooth so that a true monolayer of metal may be achieved. Any of metal layers 23, 23a, 23b may have nanoscopic thickness. For example, the thickness may be in a range from at least atomic thickness to at most 10 nm.

Referring still to FIGS. 2(A)-2(B), any of metal layers 23, 23a, and 23b may contain a material selected from the group consisting of semiconductors, metals, alloys, and combinations thereof. Exemplary semiconductors include Si. Exemplary metals include Ag, Al, Co, Cu, Fe, Ge, Mg, Mo, Nb, Ni, Pd, Pt, Ru, Ta, Ti, W, Zn, Zr, and the like. Exemplary alloys include bimetallics, stainless steel, permalloy, hastalloy, and superalloys, such as $TiN_x$, $TialN_x$, SiN, CN, and CrSi. The material may be a transition metal. Transition metals include Group 4 metals (Ti, Zr, Hf), the lanthanide metals (Ce, Pr, Nd, and the like), Group 5 metals (V, Nb, Ta), Group 6 metals (Cr, Mo, W), Group 7 metals (Mn, Tc, Re), Group 8 metals (Re, Ru, Os), Group 9 metals (Co, Ru, Os), Group 9 metals (Co, Ru, Ir), Group 10 metals (Ni, Pd, Pt), Group 10 metals (Ni, Pd, Pt), and Group 11 metals (Cu, Ag, Au). For example, the transition metal may be selected from among Groups 8-11 of the Periodic Table of the Elements. Metals layers 23a and 23b may contain at least one material in common. Alternatively, metal layers 23a and 23b may contain at least one material not in common. When metal layer 23b contains a material different from metal layer 23a composite particle 20 may be adapted to contain co-catalytic metals. For example, metal layer 23a may contain a first catalytic metal and metal layer 23b may contain a second catalytic metal. Alternatively or in combination, a single layer, any one of metal layers 23, 23a, and 23b may contain at least two different materials. Thus, any one of metal layers 23, 23a, and 23b may contain co-catalytic metals.

Referring still to FIGS. 2(A)-2(B), support layer 24 may contain a dielectric material. Exemplary dielectric materials include, but are not limited to, $SiO_2$, SiO, $TiO_2$, $ZrO_2$, $FeO_3$, $WO_3$, $Nb_2O_5$, $Ta_2O_5$, $CeO_2$, $Al_2O_3$, ZnO, indium tin oxide (ITO), MgO, $MgF_2$, $NaAlF_6$, $CaF_2$, ZnS, diamond-like carbon (DLC), graphite, diamond, and pyrolytic carbon. Thus, support layer 24 may include a material selected from the group consisting of inorganic oxides, inorganic fluorides, inorganic sulfides, carbon allotropes and combinations thereof. An inorganic oxide may be a metal oxide. Support layer 24 may be catalytically inert.

Referring still to FIGS. 2(A)-2(B), composite particle 20 may be planar. When the composite particles 20 are planar, they tend to lay flat, which provides an ability to organize sequential layers of metal layers 23. It is expected that this organization will increase the catalytic activity per area of material as contrasted, for example, with irregularly shaped porous supports that tend to have low packing densities and can have areas with metals that are not exposed to reactants.

Referring still to FIGS. 2(A)-2(B), the thickness of metal layer 23 may be sufficiently small so as to provide a nano-catalytic enhancement. For example, it is expected that monolayer metal thickness improves catalytic activity because there is preliminary evidence in the literature that the catalytic activity of metals with one dimension at atomic thickness exhibit unique catalytic properties. See, for example, D. W. Goodman, "Catalytically Active Au on Titania: yet another example of a strong metal support interaction (SMSI)?,"

Catalysis Letters 99 (2005), pp. 1-2 and W. T. Wallace, B. K. Min, D. W. Goodman, "The nucleation, growth, and stability of oxide supported metal clusters," Topics in Catalysis 34 (2005), pp. 17-30.

Referring still to FIGS. 2(A)-2(B), any of metal layers 23, 23a, and 23b may have a structure adapted for improving catalytic activity. This structure may be any one or combination of physical structure, electronic structure, and crystal structure.

Figure 3A:
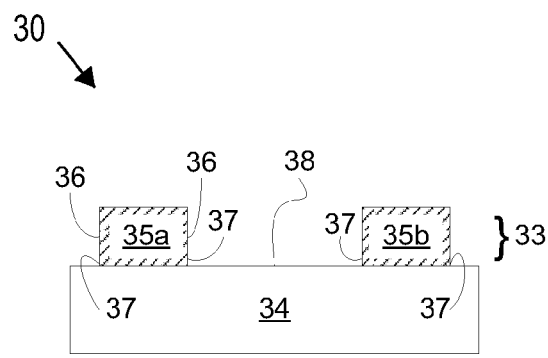
FIGS. 3(A)-3(B) depict cross-sectional views of a composite particle comprising a discontinuous metal layer disposed about a support layer, in accordance with some embodiments of the present invention.
Figure 3B:
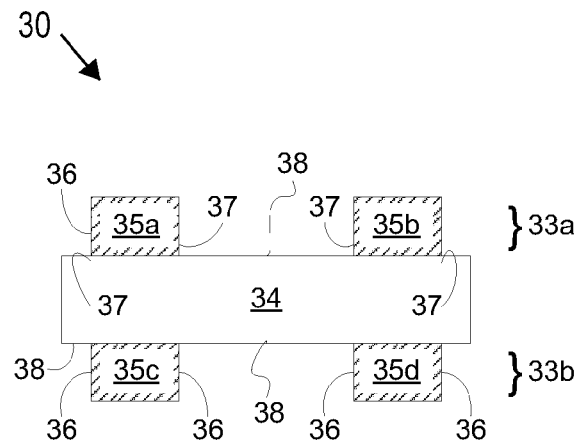

Referring now to FIGS. 3(A)-3(B), composite particle 30 may include any one or combination of discontinuous metal layers 33, 33a, and 33b disposed about support layer 34. Any one or combination of metal layers 33, 33a, and 33b may include a plurality of islands, such as 35a, 35b and 35c, 35d. As used herein island refers to any one or combination of islands 35a, 35b, 35c, and 35d. It will be understood that, although two islands are shown in each layer, each layer may contain any suitable number of islands. An island may include at least one edge 36. An edge 36 may include a plurality of edge sites 37. An edge site may be uncoordinated. Thus, an edge site may include at least one atom or molecule having an unfilled electronic orbital. An island may have a diameter between about 0.1 nm and about 5.0 nm. When an island has an irregular shape, the diameter is defined as the two-dimensional average distance of a straight line passing through the center of the island. Islands may include a single material. Alternatively, islands on opposing faces 38 may include different materials. For example, islands 35a and 35c may contain materials not in common.

Referring still to FIGS. 3(A)-3(B), the islands may be planar. The perimeter shape of an island may be any suitable two dimensional geometrical shape. For example, suitable shapes include circles, squares, pentagons, hexagons, and the like. At least a portion of the islands may be isolated. Alternatively or in combination, at least a portion of the islands may link to form a network. A network may have a connectivity above the percolation threshold. Alternatively, a network may have a connectivity below the percolation threshold.

Referring still to FIGS. 3(A)-3(B), the islands may have a nanoscopic thickness. For example, the thickness may be in a range of from at least atomic thickness to at most 10 nm. When an island has a thickness below 5 nm, the island may have a two dimensional structure commonly referred to as a "model." An advantage of the present catalyst and method of making it is that such model structures may be produced in production quantities.

When the metal layer has a discontinuous structure the thickness of the metal layer may be defined as the vertical displacement at the center of each segment (e.g. island) of the discontinuous layer measured by methods known to those skilled in the art including but not limited to scanning electron microscopy, transmission electron microscopy, scanning tunneling microscopy, atomic force microscopy and those techniques defined in ASME B46.1-2002, Chapter 7—Nanometer Surface Texture and Step Height Measurements by Stylus Profiling Instruments. Each segment in a discontinuous layer typically has the same thickness.

Referring again to FIGS. 3(A)-3(B), the islands may be surrounded by exposed support surface segments 38. Exposed support surface segment 38 may have high adsorbate mobility. Exposed support surface segment 38 may be planar.

Method of Making Composite Platelet

A method of making a catalyst particle may include providing a web material having a release layer formed on an upper surface thereof, forming a composite film on the web material, and removing the composite film from the web material as a plurality of composite particles. The composite film may be formed by physical vapor deposition. Forming the composite film may include controlling the forming so as to control the structure of the catalyst. Further, forming the composite film may include forming a first metal film on the release layer, forming a support film on the first metal film, and forming a second metal film on the support film so as to form the composite film, where the composite film includes the first metal film, the support film, and the second metal film. Forming the composite film may include controlling the forming so as to control the structures of the first and second metal films. The first and second metal films may include the same materials. Removing the composite film may include comminuting the film so as to form the plurality of composite particles. The composite particles may be any of the above-described embodiments of composite particles.

Thus, a method for supplying a catalytic surface may include any one or combinations of the steps of: providing a web material having a release layer formed on an upper surface thereof; forming a first metal layer on the release layer, the first metal layer having a thickness in the range of from at least about 1 nm to at most about 10 nm; forming a support layer on the first metal layer, the support layer having a thickness in the range of from at least about 50 nm to at most about 1 micron; forming a second metal layer on the support layer, the metal layer having a thickness in the range of from at least about that of a partial monolayer to at most about 10 nm, so as to form a composite film comprising (i) the first metal layer, (ii) the metal oxide layer, and (iii) the second metal layer; and removing the composite film from the web material as a plurality of supported metal platelets, wherein the platelets comprise a diameter of at most about 150 microns, and wherein the platelet comprises an aspect ratio of at least about 6.5.

Depositing a metal film may include atomic level precision. Thus, depositing a metal film may include controlling the physical structure of the surface of the metal layer. Further, depositing a metal film may include controlling the electronic structure of the surface of the metal film. Still further, depositing a metal layer may include controlling the crystal surface structure of the metal film.

Deposition of a metal film may include monitoring the thickness of the film. Exemplary methods of monitoring the thickness include quartz crystal balance, optical property monitoring (reflection, interference, transmission), ellipsometric, electrical conductivity and like methods known to those skilled in the art.

It has been discovered by the present inventors that when making a composite particle with metal layer islands on both face surfaces of the support, the methods disclosed herein may be used to provide a layered composite particle without the support filling in the spaces not occupied by metal layer islands.

A composite particle made by the present process may possess catalytic activity without post-processing steps such as are typically used when the metal layer is deposited by wet chemical methods. That is, the metal layer may be deposited in a catalytically active state and remain in a catalytically active state through steps following the deposition. Thus, treatments such as sintering that may adversely effect the support properties, such as structure, acidity, and metal interaction, are not required. This has the advantage that metal/support interactions are not restricted by the steps of preparing the composite particle.

Vacuum Roll Coating

Vacuum roll coating is an exemplary method of making a composite particle, where the method of forming a precursor composite film includes physical vapor deposition.

Vacuum roll coating utilizes processes similar to those used in ultrahigh vacuum (UHV) surface science studies of ideal surfaces and is a cost effective bridge between the "theoretical" surfaces identified for optimum catalytic activity and a "real world" application. This industrially mature technology is utilized to coat oxides and metals at well-controlled nanometer thicknesses, for example 1 nm to 100 nm, over large areas that can be removed from the substrate to form free standing planar platelets with very high aspect ratios and surface areas. Exemplary techniques are described in U.S. Pat. Nos. 5,077,258, 5,135,812, and 6,317,947.

Vacuum roll coating is adapted to produce single and multi-layer films that benefit from precise control of the layer thickness, material stoichiometry, and structure. As used to make a composite particle, vacuum roll coating is adapted for controlling the layer thickness, material stoichiometry, and structure of the composite particle.

A method of making a composite particle may include comminuting a deposited composite film into platelets. This may provide a free standing powder. The powder may have film qualities than can be incorporated easily into existing particle based catalyst platforms. Typically, comminuting does not change the physical or chemical attributes of a composite particle metal layer derived from a deposited composite film.

The use of vacuum roll coating as a process for manufacturing composite particles presents an opportunity to optimize material surface area, investigate materials not found in nature, such as unique alloys or engineered structures, and combine functionalities, such as catalysis, sensing, and power, that tend not to be achieved by conventional methods of making supported catalysts.

Deposition of one or both of a support film and a metal film under vacuum conditions opens the possibility of tailoring the support surface and metal deposition to get individual atom dispersions that could exhibit the enhanced catalytic activity reported for model nanoparticle systems. For example, atomistic metal deposition and monolayer growth may utilize the same vacuum processes that produce model single crystal and experimental films that exhibit unique properties under laboratory conditions.

By way of example and not limitation, the present inventors have found that the following materials can be vacuum deposited as single layers, multi-layers, or as mixtures at monolayer or less thickness under highly controlled environments. Semiconductors include Si. Metals include Ag, Al, Co, Cu, Fe, Ge, Mg, Mo, Nb, Ni, Pd, Pt, Ru, Ta, Ti, W, Zn, and Zr. Alloys include bimetallics, stainless steel, permalloy, hastalloy, and superalloys, such as $TiN_x$, $TialN_x$, SiN, CN, and CrSi. Dielectric materials include $SiO_2$, SiO, $TiO_2$, $ZrO_2$, $FeO_3$, $WO_3$, $Nb_2O_5$, $Ta_2O_5$, $CeO_2$, $Al_2O_3$, ZnO, indium tin oxide (ITO), MgO, $MgF_2$, $NaAlF_6$, $CaF_2$, ZnS, diamond-like carbon (DLC), graphite, diamond, and pyrolytic carbon.

The vacuum roll coating technology is also adaptable to other materials and film thicknesses for continued optimization of the catalytic performance. For example, any one or combination of unique support features such as reduced, mixed, and synthetic (conducting oxides, perovskites, and the like) oxides, and other inorganic compounds, can be introduced that enhance the catalytic performance.

Vacuum roll coating allows the production of atomically thin and smooth films in large areas that tend to be more difficult to obtain using chemical or naturally occurring atmospheric processes.

Vacuum roll coating has the advantage that it is adapted to producing thin films with functional tolerances at the nanometer scale and with economic price points per square foot of area. In particular, the nanocatalytic benefits of the present composite particles are expected to contribute to making the technology economically attractive. For example the activity per unit area of cost is contemplated to be advantageous.

Catalytic Applications

The present inventors contemplate applying the present composite platelet to various catalytic processes where a platelet catalyst may be advantageous, such as processes involving reactions with pore size or environmental issues. Exemplary applications include proton exchange membrane (PEM) fuel cell cathode, polymerization, hydrocracking, and oxidation. Potential combinations of materials made by vacuum may exhibit enhanced activity over those made by traditional techniques. The enhanced activity may arise, for example, due to factors such as the precise deposition control and strong interactions between the support material and the catalytic material that can be generated.

The platelet catalyst may be applied to any metal and support pairs that exhibits a nanocatalytic enhancement in various reactions. Contemplated reactions include CO oxidation, acetylene polymerization, cyclohexane hydrogenation, hydrogen oxidation, toluene hydrogenation, and ammonia synthesis. Contemplated metal/support pairs include: $Pd/SiO_2$, Pd/MgO, $Au/TiO_2$, Au/MgO, $Pt/SiO_2$, Pt/graphite, $Pt/Al_2O_3$, Ni/graphite, and Ru/graphite. In particular, any one of $Pd/SiO_2$, $Au/TiO_2$, and Au/MgO may be applied to CO oxidation. Pd/MgO may be applied to acetylene polymerization. $Au/TiO_2$ may be applied to $SO_2$ decomposition. $Pt/SiO_2$ may be applied to cyclohexane hydrogenation, for example at 100° C. Pt/graphite may be applied to hydrogen oxidation, for example in fuel cells. $Pt/Al_2O_3$ may be applied to ethylene hydrogenation. Ni/graphite may be applied to toluene hydrogenation. Ru/graphite may be applied to ammonia synthesis.

The following examples are provided to more fully illustrate some of the embodiments of the present invention. It should be appreciated by those of skill in the art that the techniques disclosed in the examples which follow represent techniques discovered by the inventors to function well in the practice of the invention, and thus can be considered to constitute exemplary modes for its practice. However, those of skill in the art should, in light of the present disclosure, appreciate that many changes can be made in the specific embodiments that are disclosed and still obtain a like or similar result without departing from the spirit and scope of the invention.

EXAMPLE 1

Vacuum Deposition Procedure

This example illustrates a method of making a platelet catalyst that includes depositing a composite film on a web and releasing the film from the web as a plurality of composite particles.

In a typical procedure, a method of manufacturing a catalytic platelet may include providing a vacuum chamber of a conventional type which is evacuated by the use of vacuum pumps to a suitable vacuum as, for example, $10^{-5}$ Torr. A water cooled crucible is provided within the chamber and filled with a suitable oxide support material and a second water cooled crucible is filled with a catalytic metal. The support and metal are adapted to be evaporated by an electron beam gun to provide a vapor stream. Typically in such a vacuum chamber, a shutter is used to cover the crucible until the crucible gets up to temperature and the material starts evaporating. As soon as the evaporative state is reached, the shutter is opened and the coating of a plastic film substrate is monitored by a crystal monitor. As soon as the thickness on the crystal monitor reaches a predetermined thickness, the shutter is closed and the electron gun is turned off. The support and metal are deposited sequentially onto the plastic substrate to form a multilayer film.

The chamber is then permitted to cool for a suitable period of time, as for example, approximately 15 minutes, after which the chamber can be vented and the coated plastic film can be removed. The entire coating process in the vacuum chamber is carried out at room temperature. The only heat which is generated is that which is created during the evaporation of the metal by the electron beam gun.

It should be appreciated that in place of the electron beam gun which is utilized for evaporating the metal, that a magnetron sputtering device can be utilized to provide a vapor stream, rather than utilizing an electron beam gun. In the sputtering process, the pressure of argon (Ar) gas is, for example, $10^{-3}$ Torr. Sputtering is desirable because it is more efficient in the use of material. The only material which is utilized goes directly to the substrate. Utilizing an electron beam gun for evaporation, the metal is evaporated into a wide stream in accordance with a cosine distribution so that the interior of the chamber is coated as well as the substrate. Sputtering has a disadvantage in that it is slower. The sputtering process is more controllable which makes it possible to provide coatings of a given thickness based upon time and rate. This is difficult to achieve by electron beam evaporation and it is for that reason that a monitor is utilized with electron beam evaporation to ascertain the thickness of the material deposited.

A more commercially viable vacuum process utilizes a roll coater, which can electron beam evaporate or sputter the support and metal. The roll coater is comprised of a vacuum chamber which can be pumped down to a suitable pressure, such as $10^{-5}$ Torr. Typically, the practice is to evacuate the chamber to obtain the best possible vacuum which results in good support/metal adherence whether or not sputtering or electron beam evaporation is utilized. The plastic substrate or web which is to be coated is provided on an unwound reel disposed within the chamber and is taken up by a take-up reel, also disposed within the chamber. The plastic substrate can have a suitable width ranging from 10 to 60 inches. In operation of the roll coater, the electron beam evaporates the support or metal to provide a high pressure cloud of molecules that impinge upon the surface of the substrate passing under a chilled drum to provide a thin film on the surface of the substrate having a suitable thickness ranging from 50 to 1000 nanometers. The layered structure of the platelet catalyst is achieved by first depositing a metal, followed by reversing the direction of the web and depositing the support and subsequently reversing the web direction to the first pass conditions and coating a metal. It should be appreciated that in some circumstances only one side of the oxide support is coated or that dissimilar metals could be deposited on the two sides of the support.

After coating, the web is removed from the roll coater and is slit to remove any defects or unwanted trim (edge non-uniformities). In the next step, the thin film is stripped from the web. By way of example, this can be accomplished by taking the rolls and placing the rolls on an unwind roller and having the web pass through a solvent bath and then being taken up by a wind-up roller. The web, as it passes through the solvent bath can pass through a series of rollers which are positioned below the level of the solvent bath. If any of the thin film coating still remains on the web as it emerges from the rollers in the bath, this remaining thin film can be removed by a metal doctor blade which scrapes the remaining thin film from the web. The doctor blade typically is positioned on the outside of the roll on the wind-up side so that any adhering flake will fall back into the solvent bath. The flakes in this operation have a tendency to drop off in sizes of approximately 50 to 200 microns.

The flakes, as they fall from the web, will fall to the bottom of the tank containing the solvent because they have a much higher specific gravity. After settling has occurred, the clear solvent liquid above the flakes can be drained from the upper part of the tank containing the solvent. The flakes can then be removed from the tank and used as hereinafter described. Alternatively, the flakes with the remaining solvent can then be filtered and pulled dry by the use of a vacuum filter of a conventional type. Thereafter, fresh solvent is sprayed over the catalytic platelets forming the filter cake remaining in the filter to remove any last traces of the soluble polymer or other extraneous material from the flakes. The filter cake is then removed from the filter and broken up and then laid out to dry in an air oven at atmospheric pressure at a suitable temperature as, for example, 150° C. for a period of time ranging from 2 to 4 hours.

After the flakes have been dried, they are placed in a suitable solvent solution, such as acetone or methanol and ultrasonically agitated using a conventional ultrasonic agitator to reduce the particle size to approximately 2-20 microns. Thereafter, the flakes are again filtered to remove the solvent and are air-dried in an atmospheric oven. In order to reduce the flakes to a still smaller size, the dried flakes are subjected to an air grind in a suitable impact mill. By using this air impact mill, sizes ranging from 2 to 5 microns can be readily achieved without destroying the catalytic properties of the platelets. A particularly attractive feature of the air impact process for producing the small size catalytic platelets is that an aspect ratio of at least 6.5 to 1 can be achieved, and a fairly narrow particle size distribution can be obtained. In addition, the air impact process eliminates the need for additional solvent dispersal and solvent removal steps. It should be appreciated that other grinding techniques can be utilized. However, care must be taken so that the grinding will not destroy the catalytic characteristics of the platelets.

EXAMPLE 2

Fuel Cell assembly

This example illustrates a method of using a platelet catalyst that includes incorporating the catalyst in a fuel cell assembly.

In a typical procedure, a fuel cell assembly utilizes a gas fuel source, gas oxidizer source, solid polymer electrolyte membrane between porous anode backing structure and porous cathode backing structure, and at least one catalyst layer that is adhered to the cathode surface of the membrane. A catalyst layer may also be provided adjacent the anode surface of the solid polymer electrolyte membrane. The catalyst layer is applied as an ink layer and addresses three criteria to efficiently contribute to the electrochemical processes in a fuel cell: proton access to the catalyst, gas access, and electronic continuity.

The catalyst platelets are incorporated into the solid polymer electrolyte membrane assembly in a multi-step process that starts with the platelet catalyst combined with a solubilized perfluorosulfonate ionomer, such as Nafion in 5% solution in a weight ratio of 1:3 Nafion (dry)/platelet catalyst. The mixture of Nafion and catalyst is prepared by adding a molar amount of NaOH equal to the Nafion and mixing well to convert the Nafion to the $Na^+$ form. The effective density is obtained by simply mixing the catalyst particles and solubilized Nafion together. Water and glycerol are added to weight ratios of about 1:5:20 for carbon/water/glycerol. The mixture is agitated with ultrasound to uniformly disperse the platelet catalyst in the ink and to form a mixture with a viscosity suitable for coating.

A release blank of Teflon film is cleaned and coated with a thin layer of mold release and the blank is painted with a layer of ink. The amount of catalyst applied to the membrane is determined from the amount of ink transferred to the surface. Typically, two coats are required to obtain the desired catalyst loading. Additional layers of ink can be applied to the blank until the desired catalyst loading is achieved. The coated blank is baked in an oven at 135° C. until dry.

An assembly of a polymer electrolyte membrane, counter electrode (anode electrode), and the coated blank is formed and placed into a conventional hot press and lightly loaded. The press is heated to a selected temperature, as an example 125° C. for Nafion and then pressed at 70-90 atm for 90 seconds. The assembly is allowed to cool and the release blank is peeled from the film, leaving the film decal containing the catalyst adhered to the membrane cathode surface. An uncatalyzed porous electrode can be applied against the film during fuel cell assembly to form a gas diffusion backing for the thin film catalyst layer.

In conclusion, the present invention provides a composite particle that is microscopically two dimensional with a third nanoscopic dimension and methods of making same. The particle may include a support and a metal layer. The metal layer may be catalytically active such that the particle is adapted to act as a catalyst.

All patents and publications referenced herein are hereby incorporated by reference. When the patents and publications referenced herein might render a term unclear, the meaning of the present specification shall prevail. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A composite particle, comprising:
   a support having a diameter up to about 150 microns and a thickness in the range from about 50 nm to about 1 micron; and
   a first metal layer disposed on said support and a second metal layer disposed on said support opposite said first metal layer, said metal layers each having a thickness in the range of from about atomic thickness to about 10 nm, wherein said metal layers are catalytically active and disposed on said support layer in discontinuous islands having a diameter between about 0.1 nm to about 5.0 nm, wherein said islands include edge sites that are uncoordinated and a portion of said islands are isolated and a portion have a connectivity above a percolation threshold of said islands and wherein said islands are positioned on an exposed support surface segments.

2. The composite particle according to claim 1, wherein at least one of said metal layers comprises a material selected from the group consisting of semiconductors, metals, alloys, and combinations thereof.

3. The composite particle according to claim 1, wherein at least one of said metal layers comprises at least one transition metal.

4. The composite particle according to claim 1, wherein said support comprises a material selected from the group consisting of inorganic oxides, inorganic fluorides, inorganic sulfides, carbon allotropes, and combinations thereof.

5. The composite particle according to claim 1, wherein said support comprises opposing face surfaces each supporting one of said metal layers.

6. The composite particle according to claim 1, wherein said first metal layer and said second metal layer comprise at least one material not in common with each other.

7. The composite particle according to claim 1, wherein said first metal layer and said second metal layer comprise at least one material in common with each other.

8. A method for nanocatalytic enhancement comprising:
   providing a composite particle, including a support having a diameter up to about 150 microns and a thickness in the range from about 50 nm to about 1 micron and a first metal layer disposed on said support and a second metal layer disposed on said support opposite said first metal layer, said metal layers each having a thickness in the range of from about atomic thickness to about 10 nm, wherein said metal layers are catalytically active and disposed on said support layer in discontinuous islands having a diameter between about 0.1 nm to about 5.0 nm, wherein said islands include edge sites that are uncoordinated and a portion of said islands are isolated and a portion have a connectivity above a percolation threshold of said islands and wherein said islands are positioned on an exposed support surface segments,
   introducing said composite particle to a process requiring catalysis.

9. The method of claim 8 wherein said process requiring catalysis is selected from the group consisting of a polymerization, hydrocracking, and oxidation reactions.

10. The method of claim 9 wherein said process requiring catalysis is a fuel cell assembly including a polymer electrolyte membrane and said composite particle is applied to said polymer electrolyte membrane.

* * * * *